(12) United States Patent
Wang (10) Patent No.: US 9,504,173 B2
(45) Date of Patent: Nov. 22, 2016

(54) PORTABLE ELECTRONIC PRODUCT

(71) Applicants: BOE TECHNOLOGY GROUP CO., LTD., Beijing (CN); Boe Optical Science and Technology Co., Ltd., Suzhou (CN)

(72) Inventor: Hongyun Wang, Beijing (CN)

(73) Assignees: Boe Technology Group Co., Ltd., Beijing (CN); Boe Optical Science and Technology Co., Ltd., Suzhou (CN)

( * ) Notice: Subject to any disclaimer, the term of this patent is extended or adjusted under 35 U.S.C. 154(b) by 0 days.

(21) Appl. No.: 14/801,931

(22) Filed: Jul. 17, 2015

(65) Prior Publication Data

US 2016/0219734 A1    Jul. 28, 2016

(30) Foreign Application Priority Data

Jan. 22, 2015  (CN) .................... 2015 2 0045307 U (51) Int. Cl.
*H04M 1/00*   (2006.01)
*H05K 5/02*   (2006.01)
*H04B 1/3888* (2015.01)
*G06F 1/16*   (2006.01)

(52) U.S. Cl.
CPC ........... *H05K 5/0234* (2013.01); *G06F 1/1626* (2013.01); *H04B 1/3888* (2013.01)

(58) Field of Classification Search
USPC ........................................... 455/575
See application file for complete search history.

(56) References Cited

U.S. PATENT DOCUMENTS

| | | | | |
|---|---|---|---|---|
| 9,118,749 | B2* | 8/2015 | Kim | H04M 1/0254 |
| 9,128,664 | B1* | 9/2015 | Tabone | G06F 1/1616 |
| 2008/0047104 | A1* | 2/2008 | Chien | E05D 11/10 |
| | | | | 16/334 |
| 2009/0170571 | A1* | 7/2009 | Alameh | H04M 1/0216 |
| | | | | 455/575.3 |
| 2010/0033069 | A1* | 2/2010 | Chang | B67B 7/16 |
| | | | | 312/333 |
| 2011/0124210 | A1* | 5/2011 | Lai | G06F 1/1632 |
| | | | | 439/131 |
| 2011/0304983 | A1* | 12/2011 | Senatori | G06F 1/1616 |
| | | | | 361/679.55 |

* cited by examiner

*Primary Examiner* — David Q Nguyen
(74) *Attorney, Agent, or Firm* — Calfee, Halter & Griswold LLP (57) ABSTRACT

This disclosure relates to the technical field of electronic products, and describes a portable electronic product, which solves the problems of fatigue, neck discomfort, health risk and the like caused by using a prior art portable electronic product. In an embodiment of this disclosure, the portable electronic product comprises a housing, wherein a back portion of the housing is provided with at least three rack mechanisms, each rack mechanism comprises: a rotary shaft, which is provided with a base at one end and a hook-shaped structure at the other end, the base is rotatably fixed in the housing; an elastic sheet, which is penetrated through by the rotary shaft and elastically fixed on the housing; and a support plate, which is provided with a through hole in one end and nested with the hook-shaped structure through the through hole, and a limit block is provided on a region, which is close to the through hole, on the support plate. Moreover, the elastic sheet is configured to limit the hinge connection between the support plate and the rotary shaft, and the limit block is configured to limit the rotating angle of the support plate, when supporting the electronic product, relative to the back portion of the housing. This disclosure is mainly used in electronic products.

10 Claims, 5 Drawing Sheets

PORTABLE ELECTRONIC PRODUCT

RELATED APPLICATION

This application claims the priority to Chinese Patent Application No. 201520045307.3 filed on Jan. 22, 2015, which is incorporated by reference herein in its entirety.

TECHNICAL FIELD

This disclosure relates to the technical field of electronic products, and more particularly relates to a portable electronic product.

BACKGROUND

With rapid development of the information industry, portable electronic products such as a tablet computer, an electronic book and a large-screen cellphone have become increasingly popular. These products belong to handheld electronic products, and facilitate its use for a user at anytime or anywhere.

At present, with the functionality development of portable electronic products, taking a large-screen cellphone (i-phone, Samsung note-series cellphone, and the like) as an example, a user usually uses the large-screen cellphone to watch a movie, perform a video call and the like. At this moment, if the user holds the large-screen cellphone for a long time, it will easily cause a feeling of fatigue due to continuously exerting a force by hand. Therefore, in a case where environmental conditions permit, the user usually puts the large-screen cellphone on a support article, for example, a desktop. Particularly, the user may keep the large-screen cellphone flat on the desktop, thereby avoiding the feeling of fatigue caused by holding the large-screen cellphone for a long time. Alternatively, the user may abut one end of the large-screen cellphone against the desktop and hold the other end with his hand, thereby making the large-screen cellphone keep a certain angle of inclination.

However, when the large-screen cellphone is kept flat on the desktop, the user usually needs to keep gestures of stretching the neck and lowering the head down so as to watch, which may cause a result that the user is very tired and the neck is uncomfortable. Meanwhile, when the user holds the cellphone with his hand to watch, the long-time holding may cause the fatigue as well, thereby endangering the user's health.

SUMMARY OF THE INVENTION

An embodiment of this discloses provides a portable electronic product, which solves the problems of fatigue, neck discomfort, health risk and the like caused by using a prior art portable electronic product.

To achieve the above objective, an embodiment of this disclosure employs the following technical solution:

A portable electronic product comprises a housing, wherein a back portion of the housing is provided with at least three rack mechanisms. Each of the rack mechanisms comprises: a rotary shaft, which is provided with a base at one end and a hook-shaped structure at the other end, the base is rotatably fixed in the housing; an elastic sheet, which is penetrated through by the rotary shaft and elastically fixed on the housing; and a support plate, which is provided with a through hole in one end and nested with the hook-shaped structure through the through hole, and a limit block is provided on a region, which is close to the through hole, on the support plate. Moreover, the elastic sheet is configured to limit the hinge connection between the support plate and the rotary shaft, and the limit block is configured to limit the rotating angle of the support plate, when supporting the electronic product, relative to the back portion of the housing.

In an embodiment, the elastic sheet can move between an initial position and a depressed position under an extruding force. In the initial position, the elastic sheet is located in a position, which is further away from the base, in the opening of the hook-shaped structure; and in the depressed position, the elastic sheet is located in a position, which is closer to the base, in the opening of the hook-shaped structure.

In an embodiment, the elastic sheet comprises a straight plate parallel to the housing and an inclined plate fixedly connected with the straight plate. A circular hole penetrated through by the rotary shaft is provided on the straight plate. The inclined plate inclines towards the housing, and the free end thereof is fixedly connected with the housing.

In an embodiment, the support plate comprises an arc-shaped plate and a flat plate fixedly connected with one end of the arc-shaped plate. The through hole is provided close to the free end of the arc-shaped plate and is a rectangular hole. The limit block is a spherical bump, which is provided on the arc-shaped plate and located between the rectangular hole and the non-free end of the arc-shaped plate.

In an embodiment, the free end of the arc-shaped plate is provided with two arc-shaped bulges, which are symmetrically arranged at two sides of the rectangular hole, and are equal to the arc-shaped plate in bending radian.

Particularly, when controlling the support plate to rotate around a hinge axis (which passes through the hinge point and is perpendicular to the rotary shaft) to support the electronic product, the arc-shaped bulges depress the straight plate of the elastic sheet and move far away from the opening of the hook-shaped structure. When the spherical bump abuts against the straight plate of the elastic sheet, the support plate is limited in a support position by virtue of an interaction between the arc-shaped bulges and the elastic sheet.

When the rack mechanism is not used, the flat plate fits together with a back surface of the housing, and the arc-shaped plate is enclosed with the inclined plate of the elastic sheet.

Particularly, the rotary shaft comprises a column body, wherein the base is a circular platform extending outwards from the column body, and a mounting hole which conforms to the column body in structure and size is provided in the housing.

In an embodiment, the hook-shaped structure may be of an arc-shaped arrangement.

DETAILED DESCRIPTION OF THE INVENTION

A portable electronic product provided by an embodiment of this disclosure will be described below in detail in conjunction with the accompanying drawings.

As shown in FIG. 1 to FIG. 5, an embodiment of this disclosure provides a portable electronic product, comprising a housing 10, wherein a back portion of the housing 10 is provided with at least three rack mechanisms 101. Each rack mechanism 101 comprises: a rotary shaft 11, which is provided with a base 42 at one end and a hook-shaped structure 43 at the other end, the base 42 is rotatably fixed in the housing 10; a elastic sheet 12, which is penetrated through by the rotary shaft 11 and elastically fixed on the housing 10; and a support plate 13, which is provided with a through hole 33 in one end and nested with the hook-shaped structure 43 through the through hole 33, and a limit block 14 is further provided on a region, which is close to the through hole 33, on the support plate 13. Moreover, the elastic sheet 12 is configured to limit the hinge connection between the support plate 13 and the rotary shaft 11, and the limit block 14 is configured to limit the rotating angle of the support plate 13, when supporting the electronic product, relative to the back portion of the housing.

In the portable electronic product provided by an embodiment of this disclosure, the back portion of the housing is provided with at least three rack mechanisms. Each rack mechanism comprises: a rotary shaft, which comprises a base rotatably fixed in the housing and a hook-shaped structure located outside the housing; an elastic sheet, which is penetrated through by the rotary shaft and elastically fixed on the housing; and a support plate, which is provided with a through hole nested into the hook-shaped structure so as to realize a hinge connection between the support plate and the rotary shaft, and a limit block is provided on the support plate. In conclusion, when the above rack mechanism is used to support the portable electronic product, a user manually controls the support plate to rotate around a hinge axis, such that the support plate rotates and drives the limit block on it to move together. When the limit block abuts against the elastic sheet or the housing, continuous rotation of the support plate can be limited, so that the support plate is opened to support the electronic product. The elastic sheet is configured to limit the hinge connection between the support plate and the rotary shaft, that is, to ensure that the support plate is not separated from the rotary shaft, and the limit block can limit the rotating angle of the support plate, when supporting the electronic product, relative to the back portion of the housing. Moreover, the rotary shaft can rotate in the housing, and thus can drive the support plate hinged with it to rotate around the rotary axis, thus adjusting the supporting orientation by the support plate, that is, realizing horizontal supporting or longitudinal supporting of the electronic product. Thus, in the portable electronic product of this embodiment, because the rack mechanism is capable of supporting, for example, obliquely supporting, the electronic product on a desktop, it is convenient for the user to naturally and comfortably watch a screen, thereby avoiding neck discomfort. Moreover, by virtue of the supporting by the rack mechanism, there is no need for the user to watch the electronic product with holding by hand, thereby avoiding the easily caused fatigue and health risk for the user.

Here, in order to facilitate understanding the working principle of the rack mechanism in this embodiment, taking an electronic product Pad which is frequently used in daily life as an example.

Figure 7:
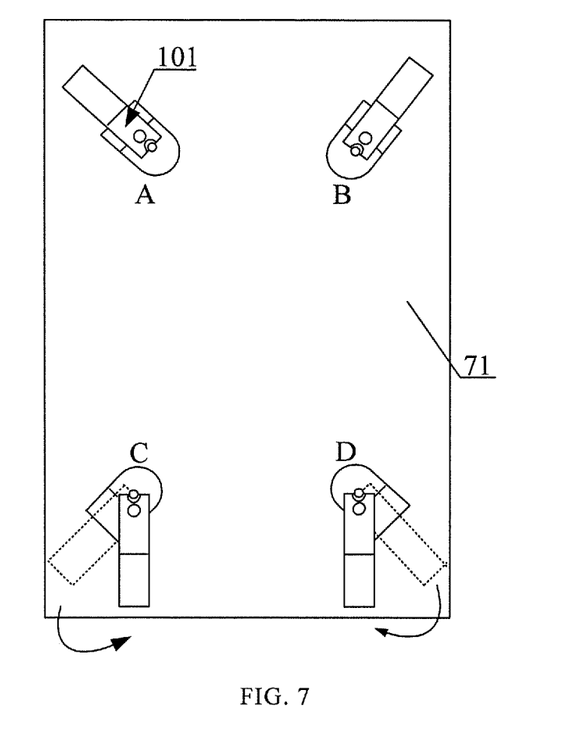
FIG. 7 is a schematic view of a rack mechanism of a portable electronic product provided by an embodiment of this disclosure.
Figure 8:
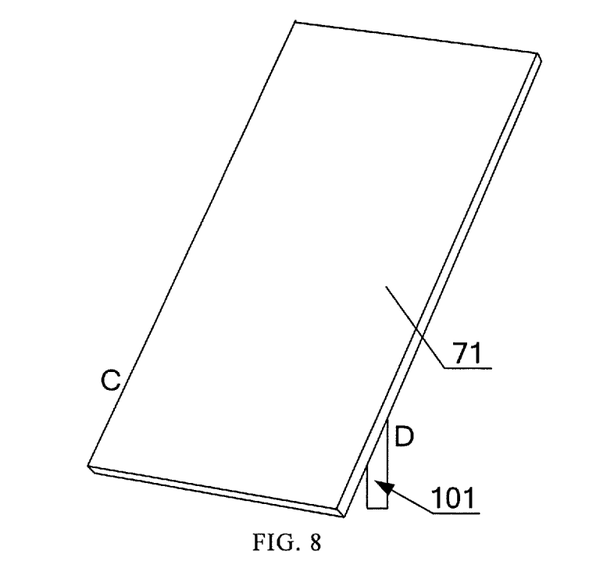
FIG. 8 is a schematic view of a rack mechanism of a portable electronic product provided by an embodiment of this disclosure at the time of longitudinal supporting.

When performing operations such as movie watching and video call with Pad in daily life, the placement of Pad will be different according to different demands of different users, and particularly, may comprise horizontal placement and longitudinal placement. Thus, in this embodiment, when performing horizontal supporting or longitudinal supporting with a plurality of rack mechanisms, it is a required to ensure cooperation among the rack mechanisms so as to guarantee the supporting stability. Therefore, as shown in FIG. 7, the back portion of the housing of the electronic product 71 (Pad) is provided with four rack mechanisms 101, and the four rack mechanisms 101 are distributed at four corners of Pad 71 in a matrix manner. Particularly, the four rack mechanisms 101 are respectively marked as A, B, C and D. When performing the horizontal supporting, A and C or B and D may be used. When performing the longitudinal supporting, A and B or C and D may be used. FIG. 8 shows a schematic view when the rack mechanism C and the rack mechanism D are used to longitudinally support Pad 71. Certainly, more (more than four) rack mechanisms 101 described above may be provided on the electronic product, but there is a need for at least three rack mechanisms. With three rack mechanisms 101 provided, connecting lines among the three rack mechanisms 101 form a right triangle, and the way for horizontal supporting or longitudinal supporting is unique.

Figure 6:
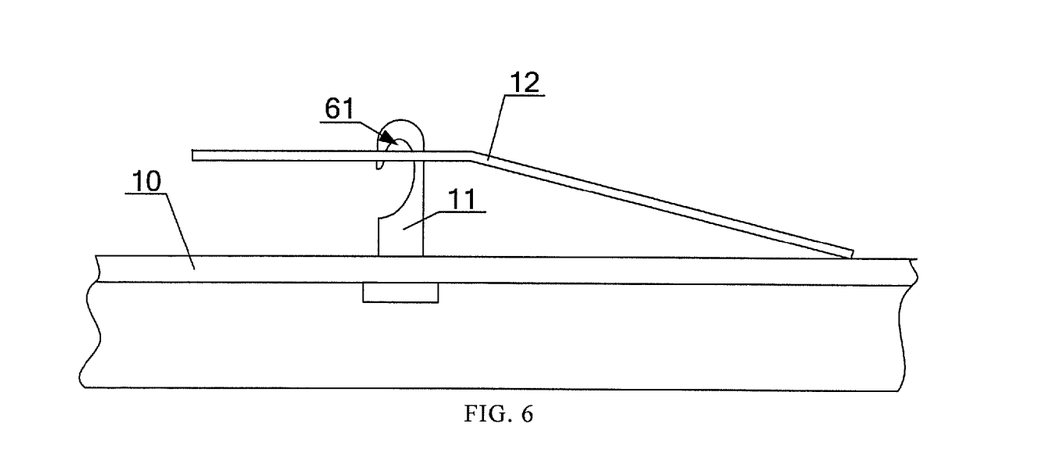
FIG. 6 is a schematic view of the elastic sheet and the rotary shaft of a rack mechanism provided by an embodiment of this disclosure at the time of being assembled.

In this embodiment, the elastic sheet 12 mainly serve to limit the hinge connection between the support plate 13 and the rotary shaft 11, thereby preventing the through hole 33 of the support plate 13 from separating out of the opening of the hook-shaped structure 43 at the time of supporting. Particularly, as shown in FIG. 6, the elastic sheet 12 is elastically fixed on the housing 10. When the elastic sheet 12 is in a natural state, that is, in the initial position, the elastic sheet 12 is not subjected to any external force and located at a position, which is further away from the base, in the opening of the hook-shaped structure 43, thus the upper surface of the elastic sheet 12 and the hook-shaped structure 43 form a sealing space 61. When the elastic sheet is subjected to a downward extruding force, the elastic sheet 12 will move to a depressed position from the initial position under a pressure, and is now located in a position, which is closer to the base, in the opening of the hook-shaped structure 43, thus the support plate 13 can be mounted or dismounted via the opening. After the support plate 13 is mounted (that is, hinged) via the opening or dismounted from the hook-shaped structure 43, the elastic sheet 12 returns to the initial position under an elastic force generated by self compression.

Figure 5:
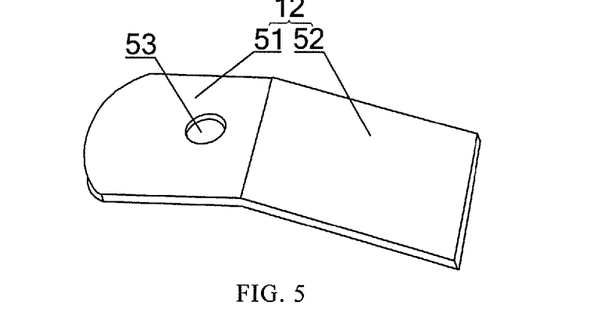
FIG. 5 is a schematic structural view of the elastic sheet of a rack mechanism provided by an embodiment of this disclosure.

One implementation of the elastic sheet 12 is shown in FIG. 5, wherein the elastic sheet 12 comprises a straight plate 51 arranged parallel to the housing 10, and a inclined plate 52 which is fixedly connected with one end of the straight plate 51 and inclines towards the housing 10, wherein the straight plate 51 may be a rectangular plate and the like. In this way, with a fixed connection, for example, welding and the like, between the free end of the inclined plate 52 and the housing 10, a fixed connection between the elastic sheet 12 and the housing 10 may be achieved. In addition, a circular hole 53 penetrated through by the rotary shaft 11 is provided on the straight plate 51. At this moment, the inclined plate 52 is mainly used to support and fix the straight plate 51, thereby ensuring a gap between the straight plate 51 and the housing 10, which allows for a depressing movement. In addition, for the fixation between the elastic sheet 12 and the housing 10, removable connections such as by means of pin-peg may also be employed.

When using the rack mechanism, due to the limit block 14, the rotating angle of the support plate 13, when supporting the electronic product, relative to the back portion of the housing can be limited. For example, in the horizontal placement and the longitudinal placement of Pad, the rotating angle of the support plate 13 may be controlled as 30-60° with specific structure and size settings of the limit block 14, according to multiple tests regarding a screen watching angle in conjunction with a watching habit of the user and the like. In addition, when the portable electronic product is supported by the support plate 13, due to the gravity of Pad and the supporting of the limit block 14, it can be ensured that the support plate 13 will not automatically rotate around the hinge axis, thereby ensuring the supporting stability.

Figure 3:
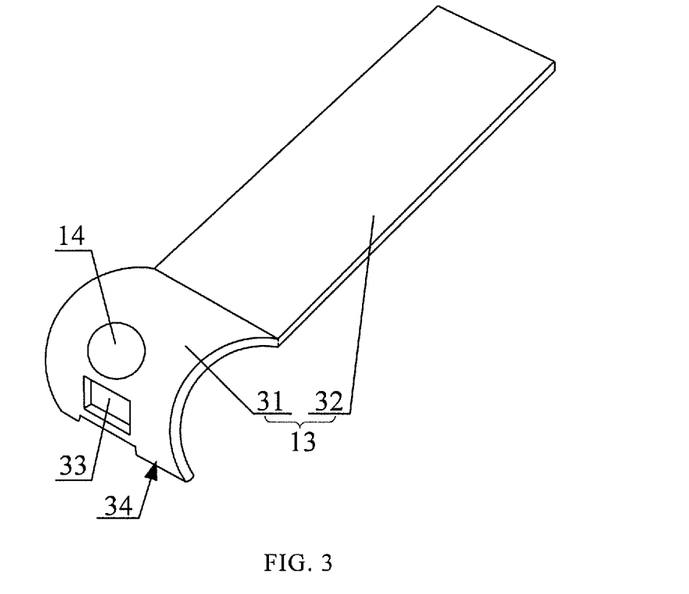
FIG. 3 is a schematic structural view of the support plate of a rack mechanism provided by an embodiment of this disclosure.

In addition, in order to facilitate carrying the electronic product (Pad), generally, the limit block 14 should preferably not be excessive large. In view of this, as shown in FIG. 3, the support plate 13 comprise an arc-shaped plate 31 and a flat plate 32 fixedly connected with one end of the arc-shaped plate 31. In addition, the through hole 33 is provided close to the free end of the arc-shaped plate 31, and thus the arc-shaped plate 31 can be hinged with the hook-shaped structure 43 through the through hole 33. When the support plate 13 rotates around the hinge axis, due to the arc-shaped plate 31, arc-shaped surfaces thereof can play a role in limiting when abutting against the elastic sheet 12 or the housing 10. Therefore, by providing the limit block 14 on the arc-shaped plate 31 and allowing it located between the through hole 33 and the non-free end of the arc-shaped plate 31, the cooperation of the arc-shaped plate 31 and the limit block 14 is promoted, and thus the rotating angle of the support plate 13, when supporting the electronic product, relative to the back portion of the housing is limited.

The above through hole 33 may be set as a rectangular hole, so as to nest into the hook-shaped structure 43. Certainly, the through hole 43 may also be a circular hole and the like. The limit block 14 may be set as a spherical bump, wherein the spherical bump is adapted for an appearance design, and when the limit operation is performed, an interaction force between the limit block 14 and the elastic sheet 12 or the housing 10 is also relatively uniform.

Here it is stated that, because the elastic sheet 12 is located outside the housing 10, that is, a gap exists between the elastic sheet 12 and the back surface of the housing 10, when the limit operation is performed with the arc-shaped plate 31 and the limit block 14, the arc-shaped surface and the limit block 14 may abut against the elastic sheet 12, thereby further reducing sizes of the arc-shaped surface and the limit block 14, and facilitating carrying the electronic product and the like.

In addition, when the user uses Pad, the position of Pad is moved usually for convenience or other demands. Or, when supporting Pad without the rack mechanism 101, due to the lack of a mutual abutting-against interaction between the limit block 14 and PAD, it is easy for the support plate 13 to automatically rotate around the hinge axis, thereby bringing inconvenience for the user when using and carrying PAD. In such a case, as shown in FIG. 3, the free end of the arc-shaped plate 31 is provided with two arc-shaped bulges 34, which are symmetrically arranged at two sides of the rectangular hole 33, and are equal to the arc-shaped plate 31 in bending radian. Thus, when using Pad without the rack mechanism 101, the elastic sheet 12 is in the initial position, and the arc-shaped bumps 34 on the arc-shaped plate 31 of the support plate 13 extend outwards relative to the rectangular hole 33, thereby being in contact with the surface of the elastic sheet 12. At this moment, if the support plate 13 is required to rotate around the hinge axis, there is a need to overcome the interaction force between the elastic sheet 12 and the arc-shaped bulges 34, that is, to depress the elastic sheet 12, so that the rotation of the support plate 13 can be achieved. Therefore, when an acting force is not applied to the support plate 13 to ensure that the arc-shaped bumps 34 thereof depress the elastic sheet 12, the support plate 13 can not rotate freely.

When controlling the support plate 13 to rotate around the hinge axis to ensure that the arc-shaped bumps 34 depress the elastic sheet 12, by setting the radian of the arc-shaped plate 31, the free end of the arc-shaped bumps 34 may move to or exceed the axis position of the rotary shaft 11 when the limit block 14 abuts against the elastic sheet 12, thereby allowing the arc-shaped bumps 34 in contact with the elastic sheet 12. When supporting Pad without the rack mechanism 101, in order to control the support plate 13 to allow it reversely rotating (with a direction of rotating when starting supporting as a forward direction), there is a need to overcome the interaction force between the elastic sheet 12 and the arc-shaped bulges 34, that is, to depress the elastic sheet 12, so that the reverse rotation of the support plate 13 can be achieved.

As a result, in a process from not-using to using for supporting and then to out of using of the rack mechanism 101, the movement process of the elastic sheet 12 may be from the initial position, to be depressed (at this moment, using for supporting), then to the depressed position, and then to the initial position (that is, out of using), alternatively may be from the initial position, to be depressed, then to the initial position (at this moment, using for supporting), then to the depressed position, and then to the initial position (that is, out of using), which depends on the structure of the arc-shaped bumps 34 of the support plate 13 and the rotating angle of the support plate 13.

Figure 1:
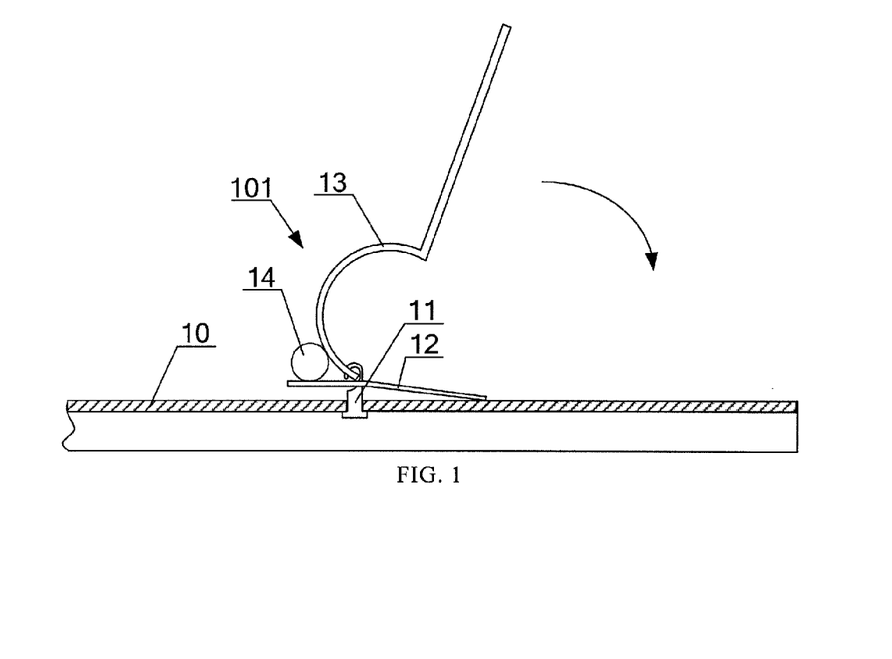
FIG. 1 is a schematic view of a rack mechanism of a portable electronic product provided by an embodiment of this disclosure at the time of supporting.

Particularly, when rotating the above support plate 13 to support the electronic product, the arc-shaped bumps 34 move far away from the opening of the hook-shaped structure 43, thereby preventing the arc-shaped bumps 34 from separating the support plate 13 out of the opening of the hook-shaped structure 43 when depressing the elastic sheet 12. As shown in FIG. 1, at this moment, the support plate 13 rotates around the hinge axis to a support position. When supporting Pad without the rack mechanism 101, the support plate 13 is controlled to move around the hinge axis along a direction shown by an arc arrow in FIG. 1.

Figure 2:
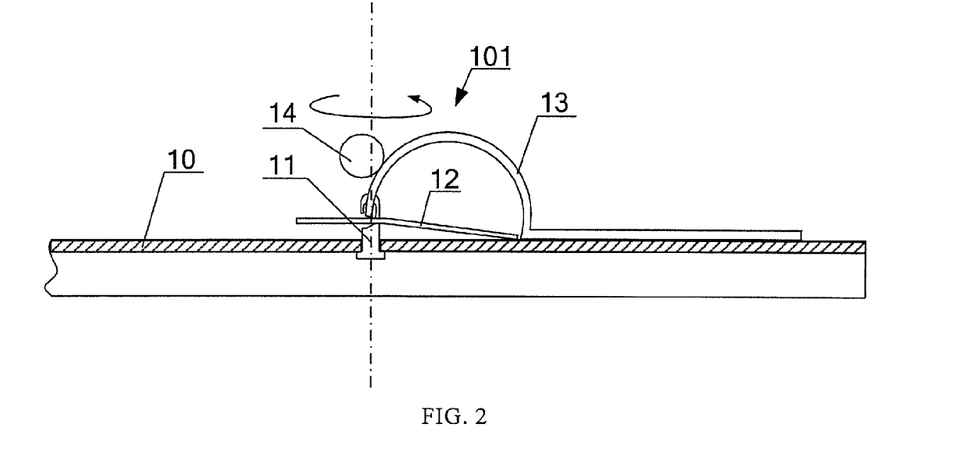
FIG. 2 is a schematic view of a rack mechanism of a portable electronic product provided by an embodiment of this disclosure at the time of not supporting.

As shown in FIG. 2, when the rack mechanism 101 is not used, the flat plate 32 of the support plate 13 may fit together with the back surface of the housing 10, at this moment, the arc-shaped plate 31 is enclosed with the inclined plate 52 of the elastic sheet 12, so that the integral assembly reasonability is ensured. In FIG. 2, the support plate 13 may rotate around a center axis of the rotary shaft 11 together with the rotary shaft 11 along a direction shown by an arc arrow in FIG. 2.

Figure 9:
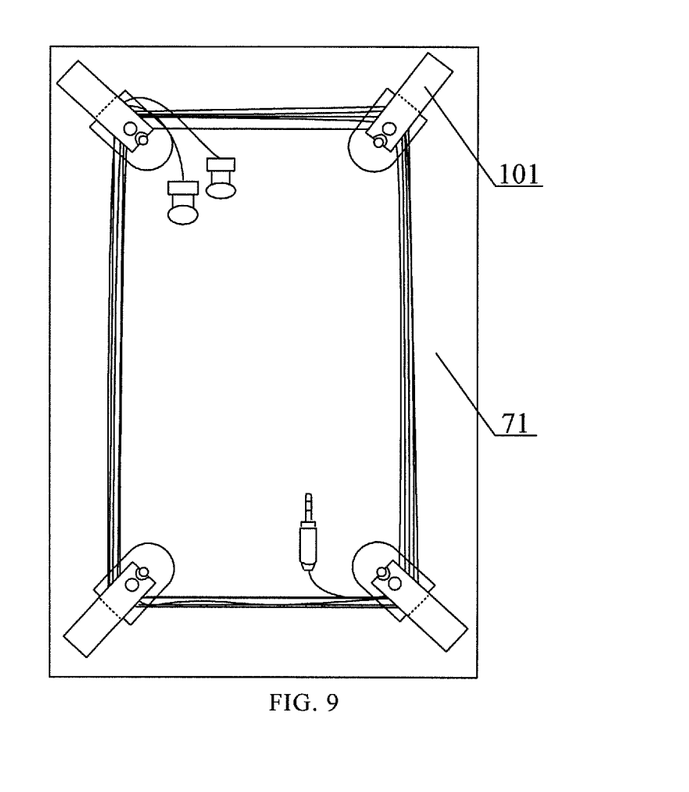
FIG. 9 is a schematic view of a rack mechanism of a portable electronic product provided by an embodiment of this disclosure at the time of accommodating earphone cables.

Generally, when the electronic product is used, in order to satisfy individual seeing and hearing demands, usually the user may use an earphone and the like. However, connecting cables of the earphone are too long, and are easily twisted and form hard knots. In such a case, if it is not carefully collected and stored, the problems of damage or loss and the like will be extremely easily caused. In the electronic product of this embodiment, particularly, taking Pad comprising four rack mechanisms 101 as an example, when Pad is not used, the four rack mechanisms may be opened to ensure that the support plate 13 of each rack mechanism 101 is kept in a support position, that is, a position in which the support plate 13 is located as shown in Fig, 1, at this moment, an angle is formed between the inclined plate 52 of the elastic sheet 12 and the support plate 13. As shown in FIG. 1 and FIG. 9, at this moment, the earphone cables may be wrapped into the four rack mechanisms 101, and certainly, any two or three rack mechanisms may be selected as well for wrapping. After the earphone cables are wrapped completely, the support plate 13 is rotated to the initial position, that is, a position in which the support plate 13 is located as shown in FIG. 2, at this moment, arc-shaped portions of the arc-shaped plate 31 of the support plate 13 form an accommodating portion for the earphone cable. Thus, reasonable collection and storage of the earphone are realized, so that the earphone is prevented from being damaged or lost.

Here it is stated that, in order to ensure that the flat plate 32 of the support plate 13 and the back surface of the housing 10 fit together with each other, it is arranged in such a way that a distance between the free end of the arc-shaped bump 34 and a plane in which the flat plate 32 is located conforms to a distance between the elastic sheet 12 in the initial position and the housing 10 surface, thereby ensuring a stable fit.

With reference to FIG. 7, generally, in order to facilitate switching the electronic product between the horizontal supporting and the longitudinal supporting, when the rack mechanism 101 is not used, the electronic product may be kept in a position in which the rack mechanism A and the rack mechanism B are located as shown in FIG. 7, at this moment, an angle 45° is formed between a center line of the rack mechanism 101 and one side of the electronic product. When the rack mechanism is required for supporting the electronic product, for example, when the rack mechanism C and the rack mechanism D in FIG. 7 are used for longitudinally supporting the electronic product, the support plate 13 may be turned to rotate around a direction shown by an arc arrow in FIG. 7, and then controlled to allow it rotating around the hinge axis, thereby achieving the supporting.

Figure 4:
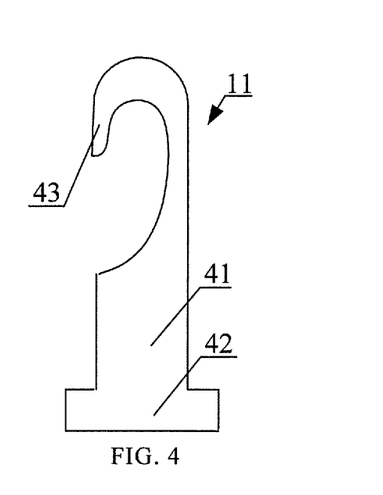
FIG. 4 is a schematic structural view of the rotary shaft of a rack mechanism provided by an embodiment of this disclosure.

In FIG. 4, the rotary shaft 11 may comprise a column body 41, and the base 42 is a circular platform extending outwards from the column body 41. Providing a mounting hole which conforms to the column body 41 in structure and size in the back portion of the housing 10, it may be ensured that the rotary shaft 11 is fixed on the housing 10, and can rotate in the housing 10 at the same time. In addition, as shown in FIG. 4, end parts, which are located outside the housing 10, of the rotary shaft 11, are spherical surfaces, and the hook-shaped structure 43 on the rotary shaft 11 are of an arc arrangement, thus ensuring that the support plate 13 can smoothly move when hinged with the rotary shaft 11.

It will be appreciated that, in the description of this disclosure, orientation or position relationships indicated by terms such as "center", "up", "down", "front", "back", "left", "right", "vertical", "horizontal", "top", "bottom", "in" and "out" are orientation or position relationships shown based on the accompanying drawings, which is merely for convenience of describing this disclosure and simplifying this description, but is not intended to indicate or imply that the apparatus or element must have a specific orientation or be constructed or operated with the specific orientation, and thus can not be interpreted as limitation to this disclosure.

Terms "first" and "second" are merely used for descriptive purposes, and can neither be interpreted as indication or implication of relative importance of the apparatus or element, nor be interpreted as implication of the number of the indicated technical features. Thus, features defined by "first", "second" and the like may explicitly or implicitly comprise one or more such features. In the description of this disclosure, "a plurality of" is defined as two or more than two unless otherwise indicated.

In the description of this disclosure, it will be appreciated that, terms "mount", "attached" and "connect" are to be construed broadly unless otherwise specifically limited. For example, it may be interpreted as fixed connection, or removable connection, or integral connection. Moreover, it may be direct connection, or indirect connection through an intermediate media, or interior communication of two elements. It will be apparent to one of ordinary skill in the art that the specific meanings of the above terms in this disclosure can be understood according to specific situations.

In the description of this specification, specific features, structures, materials or characteristics may be combined in any one or more embodiments or examples in any suitable manner.

The above content is merely a detailed description of this disclosure, but a protective scope of this disclosure is not limited to it. It will be apparent to those skilled in the art that various changes and substitutions may be readily made within a technical scope disclosed by this disclosure, and all such changes or substitutions are intended to be included within the protective scope of this disclosure. Thus, the protective scope of this disclosure should be interpreted solely in light of the accompanying claims.

The invention claimed is:

1. A portable electronic device comprising:
    a housing having at least three rack mechanisms, each rack mechanism comprising:
        a shaft having a base that is rotatably connected to the housing and a hook at an end opposite the base;
        an elastic sheet elastically attached to the housing; and
        a support plate having a through hole in an end and a region proximate the through hole that includes a limit block;
    wherein the shaft penetrates the elastic sheet and the hook is hingeably connected to the through hole of the support plate and can be rotated between an open and a closed position;
    wherein the elastic sheet is configured to prevent the disconnection of the support plate and the hook of the shaft; and wherein the limit block is configured to limit an open angle of the support plate in the open position when the support plate is supporting the portable electronic device.

2. The portable electronic device according to claim 1, wherein:
the elastic sheet is moveable between an initial position and a depressed position by a depressing force; and
the elastic sheet in the depressed position is closer to the base of the shaft than the elastic sheet in the initial position.

3. The portable electronic device according to claim 1, wherein the elastic sheet comprises:
a straight plate parallel to the housing;
an inclined plate fixedly connected to the straight plate; and
a hole in the straight plate for receiving the shaft;
wherein the inclined plate inclines toward and is fixedly connected to the housing.

4. The portable electronic device according to claim 1, wherein the support plate comprises:
an arc-shaped plate having a first end and a second end; and
a flat plate fixedly connected to the second end of the arc-shaped plate;
wherein the through hole is a rectangular hole and is proximate the first end of the arc-shaped plate; and
wherein the limit block is spherical and is disposed between the through hole and the second end of the arc-shaped plate.

5. The portable electronic device according to claim 4, wherein the first end of the arc-shaped plate includes two arc-shaped bulges symmetrically arranged on each side of the through hole and have a bending radius equal to a bending radius of the arc-shaped plate.

6. The portable electronic device according to claim 5, wherein:
rotating the support plate around a hinge axis of the hingeable connection with the hook from the closed to the open position causes the arc-shaped bulges to depress the straight plate of the elastic sheet, moving the elastic sheet away from the hook of the shaft; and
when the support plate is in the open position the limit block and arc-shaped bulges contact the straight plate, retaining the support plate in the open position.

7. The portable electronic device according to claim 6, wherein when the support plate is in the closed position the flat plate fits together with a back surface of the housing and the arc-shaped plate and the elastic sheet enclose an opening.

8. The portable electronic device according to claim 1, wherein:
the rotary shaft comprises a column body;
the base is a circular platform extending outwards from the column body; and
the housing includes a mounting hole corresponding to the column body.

9. The portable electronic device according to claim 1, wherein the hook of the shaft is arc-shaped.

10. The portable electronic device according to claim 8, wherein the hook of the shaft is arc-shaped.

* * * * *